United States Patent
Ji et al.

(10) Patent No.: US 10,210,975 B1
(45) Date of Patent: Feb. 19, 2019

(54) CASE FOR A PORTABLE ELECTRONIC DEVICE

(71) Applicant: Apple Inc., Cupertino, CA (US)

(72) Inventors: Qigen Ji, Fairfield, CA (US); Hao Zhu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/870,752

(22) Filed: Jan. 12, 2018

(51) Int. Cl.
| H01F 7/02 | (2006.01) |
| G06F 1/16 | (2006.01) |
| G01R 33/02 | (2006.01) |
| H01F 41/02 | (2006.01) |
| H01F 13/00 | (2006.01) |

(52) U.S. Cl.
CPC ........... H01F 7/0205 (2013.01); G01R 33/02 (2013.01); G06F 1/1677 (2013.01); H01F 13/003 (2013.01); H01F 41/0253 (2013.01)

(58) Field of Classification Search
CPC .. H01F 7/0205; H01F 13/003; H01F 41/0253; G01R 33/02; G06F 1/1677
See application file for complete search history.

(56) References Cited

U.S. PATENT DOCUMENTS

| 9,857,835 B2* | 1/2018 | Sun | G06F 1/1626 |
| 2009/0051174 A1* | 2/2009 | Ho | E05C 1/10 |
| | | | 292/251.5 |
| 2009/0051357 A1* | 2/2009 | Sasaki | G01R 33/091 |
| | | | 324/228 |
| 2009/0278642 A1* | 11/2009 | Fullerton | G01D 18/00 |
| | | | 335/284 |
| 2011/0018659 A1* | 1/2011 | Fullerton | H01F 7/0242 |
| | | | 335/295 |
| 2012/0068942 A1* | 3/2012 | Lauder | H01F 7/04 |
| | | | 345/173 |
| 2017/0352459 A1* | 12/2017 | Scales | H01F 7/021 |

FOREIGN PATENT DOCUMENTS

JP 6117442 B2 * 4/2017 ............. G01D 5/145

* cited by examiner

*Primary Examiner* — Mohamad Musleh
(74) *Attorney, Agent, or Firm* — Dickinson Wright RLLP

(57) ABSTRACT

This application relates to a case for a portable electronic device. The case includes a magnetic boosting device, carried in a cover of the case. The magnetic boosting device includes a layer of magnetic elements including: (i) a primary magnetic element, and (ii) a secondary magnetic element. The primary magnetic element, characterized by having magnetic poles that are aligned perpendicular to the plane of the cover, provides a first magnetic field. The secondary magnetic element, characterized by having magnetic poles that are aligned parallel to the plane of the cover, provides a second magnetic field. The first magnetic field and the second magnetic field contribute to a resultant magnetic field that is asymmetrically disposed about the plane of the cover. The electronic device can include a sensor and a controller for placing the electronic device in a power saving mode when the cover is in a closed position.

20 Claims, 13 Drawing Sheets

CASE FOR A PORTABLE ELECTRONIC DEVICE

FIELD

The described embodiments relate generally to a case for a portable electronic device. More particularly, the present embodiments relate to a magnetic boosting device embedded in a folio or cover of a case for the portable electronic device.

BACKGROUND

Many electronic devices include magnetic components that perform a variety of functions. For example, some devices include magnets embedded within a housing of the device to assist in keeping the device closed. Other devices include magnets that are utilized with a Hall effect sensor to detect proximity, position, or speed of a structure that includes the magnets.

As the design of electronic devices change, the design of the magnets embedded within such devices must also change to match new form factor requirements. For example, some devices, such as a phone or tablet, are designed to be very thin and, therefore, the thickness of a magnet embedded within the device might need to be reduced to fit the magnet in the housing. However, as the thickness of a magnet is reduced, the corresponding strength of the magnetic field generated by the magnet also decreases. The thickness of the magnet can be reduced below a threshold thickness, at which point the magnitude of the magnetic field associated with the magnet is not sufficient to perform the function that the magnet was designed to perform. Therefore, what is desired is a technique to increase the magnetic field associated with thin magnets implemented within electronic devices or accessories for electronic devices.

SUMMARY

This paper describes various embodiments that relate to cases or protective covers for portable electronic devices. Electronic devices can include sensors to detect a state of the case or cover and the operation of the electronic device can be changed in response to the detected state. In some embodiments, a portable electronic device includes a sensor to detect a magnetic field induced by a magnetic component included in a protective cover of the portable electronic device or included in a cover of a case for the portable electronic device. In some embodiments, the magnetic component is a magnetic boosting device that includes a layer of magnetic elements including: a primary magnetic element and a secondary magnetic element. The primary magnetic element, characterized by having magnetic poles that are aligned perpendicular to the plane of the cover, provides a first magnetic field. The secondary magnetic element, characterized by having magnetic poles that are aligned parallel to the plane of the cover, provides a second magnetic field. The first magnetic field and the second magnetic field contribute to a resultant magnetic field that is asymmetrically disposed about the plane of the cover.

In various embodiments, a magnetic boosting device is incorporated into a case for a portable electronic device. The magnetic boosting device can be incorporated into a cover of the case such that, when the portable electronic device is secured within the case, the magnetic boosting device moves relative to a housing of the electronic device between a closed position and an open position. In various embodiments, the magnetic boosting device is laminated between two layers of flexible material to form the cover of the case. In some embodiments, the cover of the case can include two or more magnetic boosting devices at different locations within the cover.

In other embodiments, a magnetic boosting device is incorporated into a protective cover of a portable electronic device. The protective cover can be incorporated directly into the housing of the portable electronic device. The portable electronic device includes a sensor located within a housing of the electronic device proximate the magnetic boosting device when the protective cover is in a closed position. A controller is in communication with the sensor and configured to place the portable electronic device into a power saving mode in response to detecting the protective cover in the closed position. The magnetic boosting device includes a layer of magnetic elements that extend within a plane defined by the protective cover and including: a primary magnetic element and a secondary magnetic element. The primary magnetic element, characterized by having magnetic poles that are aligned perpendicular to the plane of the protective cover, provides a first magnetic field. The secondary magnetic element, characterized by having magnetic poles that are aligned parallel to the plane of the protective cover, provides a second magnetic field. The first magnetic field and the second magnetic field contribute to a resultant magnetic field that is asymmetrically disposed about the plane of the protective cover.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
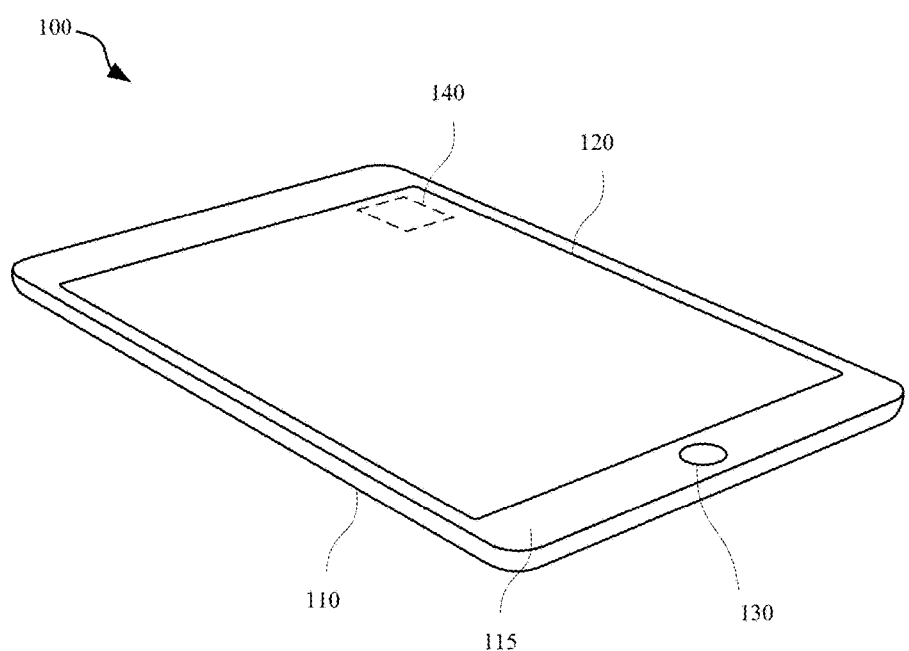
FIG. 1 illustrates a portable electronic device, in accordance with some embodiments.

Representative applications of techniques and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

In various exemplary embodiments, a magnetic boosting device can be incorporated into a cover of a case for a portable electronic device. The portable electronic device can include a sensor for detecting a magnetic field associated with the magnetic boosting device when the cover of the case is in a closed position relative to the portable electronic device. The sensor can be in communication with a controller for placing the portable electronic device in a power saving mode when the sensor detects that the cover is in a closed position. In other embodiments, a portable electronic device includes a protective cover that is movable relative to a housing of the portable electronic device. The portable electronic device can incorporate the magnetic boosting device in the protective cover. For example, the magnetic boosting device can be included in the upper portion of a laptop computer and a sensor can be included in the base portion of the laptop computer. The sensor detects when the upper portion is in a closed position relative to the base portion by detecting the magnetic field associated with the magnetic boosting device.

In various exemplary embodiments, a magnetic boosting device is described that includes a layer of magnetic elements including a primary magnetic element and at least one secondary magnetic element. The primary magnetic element provides a first magnetic field, and the primary magnetic element is characterized by having magnetic poles that are aligned perpendicular to a plane defined by the cover. A secondary magnetic element provides a second magnetic field, and the secondary magnetic element is characterized by having magnetic poles that are aligned parallel to the plane of the cover. The first magnetic field and the second magnetic field contribute to a resultant magnetic field that is asymmetrically disposed about the plane of the cover. More particularly, a magnitude of the resultant magnetic field at a first point located on a first side of the plane of the cover is larger than a corresponding magnitude of the first magnetic field at the first point. However, a magnitude of the resultant magnetic field at a second point located on a second side of the plane of the cover is smaller than a corresponding magnitude of the first magnetic field at the second point, where the first point and the second point are symmetric with respect to the plane of the cover. In various embodiments, the layer of magnetic elements can also include one or more additional secondary magnetic elements. Each additional secondary magnetic element provides a corresponding magnetic field and is characterized as having magnetic poles that are aligned parallel to the plane of the cover.

In some exemplary embodiments, each of the magnetic elements is formed by casting a ferrous powder and resin mixture in a mold to form a magnet blank. The magnet blanks can be flexible due to the structure of the magnet blanks and properties of the resin material. In other exemplary embodiments, a ferrous powder and resin mixture is formed into a sheet of a particular thickness, and magnet blanks are cut from the sheet using, e.g., a laser cutter or punch press. In yet other exemplary embodiments, the magnetic elements are formed or otherwise machined from a uniform ferrous metal or metal alloy to form the magnet blanks. After the magnet blanks are formed, the ferrous material is magnetized by subjecting the magnet blanks to an external magnetic field to align the magnetic domains within the ferrous material to an orientation of the external magnetic field. After magnetization, the magnet blanks maintain a magnetic field and can be referred to as permanent magnets. The magnets can be characterized by having magnetic poles that are aligned relative to a characteristic dimension of the magnet blanks, such as aligned relative to a thickness dimension of the magnet blanks. For example, the primary magnetic element can be characterized by having magnetic poles that are aligned perpendicular to a face of the primary magnetic element having the greatest area. In contrast, the secondary magnetic element can be characterized by having magnetic poles that are aligned parallel to a face of the secondary magnetic element having the greatest area. The primary magnetic element and the secondary magnetic element are then arranged in the layer of magnetic elements in the magnetic boosting device such that the face of the primary magnetic element having the greatest area is parallel to or coplanar with the face of the secondary magnetic element having the greatest area.

Each of the magnetic elements in the magnetic boosting device can be thin such that a characteristic physical dimension of the magnetic element is much less than other characteristic physical dimensions of the magnetic element. For example, a thickness of the magnetic elements can be less than a length, width, and/or diameter of the magnetic elements by at least an order of magnitude. The magnetic poles of the primary magnetic element are aligned with the thickness dimension, and the magnetic poles of the secondary magnetic element are aligned orthogonal to the thickness dimension.

In some exemplary embodiments, the primary magnetic element has a polygonal shape, and each secondary magnetic element also has a polygonal shape and is arranged adjacent to a corresponding side of the primary magnetic element. Examples of such embodiments include a square, rectangular, triangular, pentagonal, or hexagonal primary magnetic element and a number of rectangular secondary magnetic elements that match the number of sides of the primary magnetic element. Other examples include a polygonal primary magnetic element with secondary magnetic elements arranged on a subset of sides of the primary magnetic element.

In other exemplary embodiments, the primary magnetic element has a circular cross-sectional shape, and a single secondary magnetic element is a ring magnet that surrounds the primary magnetic element. The ring magnet is a hollow cylinder with magnetic poles aligned along the radius from a central axis of the hollow cylinder to a point normal the external surface of the hollow cylinder. The direction of the magnetic poles can be directed either toward the central axis (e.g., south to north) or away from the central axis (e.g., north to south).

In some exemplary embodiments, the magnetic boosting device includes a magnetic shunt on one side of the primary magnetic element. The magnetic shunt can extend adjacent to the secondary magnetic element(s) as well. In various embodiments, the magnetic shunt is formed from a ferrous or non-ferrous material such as Alnico or other iron alloys, aluminum or aluminum alloys, polymer resins, wood, or the like. The type of material, and the material's characteristic permeability, will change the effectiveness of the magnetic shunt at suppressing the resultant magnetic field on one side of the magnetic boosting device.

In some exemplary embodiments, at least one characteristic of the secondary magnetic element is tuned such that the magnitude of a resultant magnetic field at a particular point is reduced below a threshold value. In some embodiments, the threshold value can be substantially close to zero such that the magnitude of the resultant magnetic field is undetectable as measured at the particular point.

These and other embodiments are discussed below with reference to FIGS. 1-11; however, those skilled in the art will readily appreciate that the detailed description given herein with respect to these figures is for explanatory purposes only and should not be construed as limiting.

FIG. 1 illustrates a portable electronic device 100, in accordance with some embodiments. As shown in FIG. 1, the portable electronic device 100 can embody a mobile phone (e.g., a cellular device). The portable electronic device 100 includes a housing 110, a display 120 included on a front face 115 of the housing 110, and a button 130. Although not shown explicitly, the portable electronic device 100 can also include additional components visible on the external surface of the device, such as a camera assembly, one or more additional user interface elements (e.g., additional buttons or touch-sensitive sensors), and a charging or data port. The portable electronic device 100 can also include additional internal components such as a circuit board, integrated circuit packages or chips, a power source, and the like. Of course, the portable electronic device 100 can take additional forms in lieu of the form shown in FIG. 1, such as a laptop computer, tablet computer, digital camera, personal digital assistant, hand-held gaming system, and the like.

In some embodiments, the portable electronic device 100 includes a sensor 140. The sensor 140 is configured to detect a magnitude of a magnetic field at a location of the sensor 140. In various embodiments, the sensor 140 can be implemented as a Hall effect sensor, a magnetometer, a MEMS magnetic field sensor, or the like. It will be appreciated that the sensor 140 is configured to measure a magnitude of a magnetic field experienced by the sensor 140 at a location within the housing 110 of the portable electronic device 100 corresponding to the location of the sensor 140. In some embodiments, the magnitude of the magnetic field can be measured by reading a voltage generated by a component of the sensor 140, where the voltage indicates a magnitude of the magnetic field. The voltage can be measured using an analog-to-digital converter (ADC) and a voltage level can be stored as a digital value (e.g., integer, floating-point value, etc.) in a memory. The voltage level can then be read from the memory by a controller or a processor, and the operation of the portable electronic device 100 is adjusted in accordance with the voltage level. Alternatively, the voltage level can be compared with a threshold value using a comparator, and a signal output by the comparator indicates whether the voltage level is above or below the threshold value. The signal can then be read by a controller or a processor, and the operation of the portable electronic device 100 is adjusted in accordance with the signal. For example, in some embodiments, the portable electronic device 100 can be placed in a power saving mode when the voltage level exceeds a threshold value. In other words, increasing a magnitude of the magnetic field at the sensor 140 at or beyond a threshold value by bringing a magnet within a particular distance of the sensor 140 triggers (e.g., causes) the portable electronic device 100 to enter a power saving mode.

Figure 2:
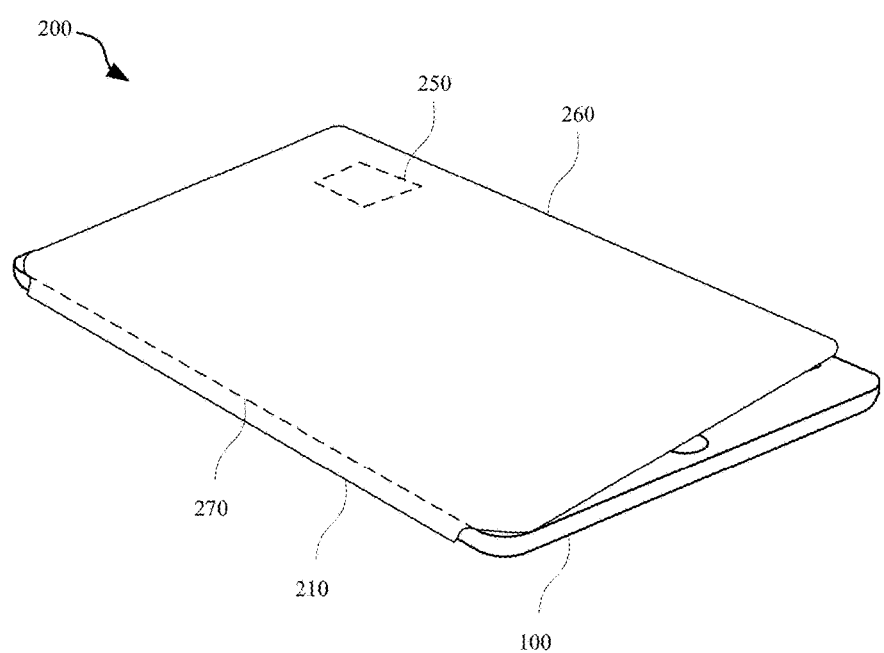
FIG. 2 illustrates a case for the portable electronic device, in accordance with some embodiments.

FIG. 2 illustrates a case 200 for the portable electronic device 100, in accordance with some embodiments. The case 200 can be designed to protect the portable electronic device 100 from scratches, damage caused from impacts, and other wear or damage incurred during typical use. The case 200 can be designed to have custom colors or graphics applied thereon to enable a user to customize the appearance of the portable electronic device 100. The case 200 can also include pockets or storage such that a user can store accessories for the portable electronic device 100, such as a stylus or Bluetooth keyboard, in the case 200 in addition to the portable electronic device 100. In some embodiments, the case 200 is constructed from a flexible material such as silicone, rubber, leather, or the like.

The case 200 includes a body 210 designed to secure the portable electronic device 100 to the case 200 and a cover 260 designed to protect a display 120 of the portable electronic device 100. The portable electronic device 100 can be attached to or secured within the body 210 of the case 200. In some embodiments, the body 210 includes a magnetic component (e.g., a magnetic array) that is attracted to a ferrous material embedded within an edge of a housing 110 of the portable electronic device 100. Alternatively, the magnetic component is attracted to corresponding magnetic components embedded within the edge of the housing 110 of the portable electronic device 100. In some embodiments, the body 210 is connected to a cover 260 of the case 200 via a hinge 270 that enables the cover 260 to rotate away from the front face 115 of the portable electronic device 100.

In some embodiments, the body 210 is designed to surround the housing 110 on all sides except for a front face 115 of the portable electronic device 100. Consequently, the portable electronic device 100 is secured within the case 200, but a user can still view the display 120 and access the button 130 located on the front face 115 of the portable electronic device 100. In other embodiments, the body 210 is designed to grip two or more edges of the portable electronic device 100 to secure the portable electronic device 100 within the case 200. The body 210 can be designed to be smaller than the housing 110 of the portable electronic device 100 but flexible enough that the body 210 can be deformed to fit over the housing 110. The tension in the deformed shape of the body 210 secures the portable electronic device 100 within the case 200 via friction at the interface between the body 210 and the housing 110 of the portable electronic device 100. In yet other embodiments, the portable electronic device 100 is secured within the case 200 using one or more mechanical connectors. For example, the body 210 can be screwed into the housing 110 of the portable electronic device 100, the body 210 and housing 110 can each incorporate mating connectors designed to snap together, or the body 210 and housing 110 can be attached via other types of mechanical fastening systems (e.g., rivets, welds, etc.). In yet other embodiments, the body 210 is laminated to the housing 110 of the portable electronic device 100 using an adhesive.

In some embodiments, the cover 260 is designed to rotate away from the front face 115 of the portable electronic device 100 around the hinge 270. It will be appreciated that, in some embodiments, the hinge 270 is a mechanical hinge assembly including a number of components. In other embodiments, the hinge 270 is simply a more flexible portion of the case 200 that is designed to allow relative motion between the body 210 and the cover 260. For example, the hinge 270 can be a portion in the silicone, rubber, or leather material that is thinner, and therefore more flexible, than adjacent portions of the case 200. Alternatively, the hinge 270 can be a portion in the case 200 constructed of a different material that is more flexible than other material in adjacent portions of the case 200. For example, a thin fabric or rubber can be laminated to a leather or plastic material of the case 200 that is less flexible than the material of the hinge 270.

Although not shown explicitly in FIG. 2, the case 200 can include a closure means for securing the cover 260 in a closed position. For example, the cover 260 can include a snap that can be secured to a mating snap when the cover 260 is in a closed position. Alternatively, the cover 260 can include magnets that are attracted to a ferrous material included in the housing 110 of the portable electronic device 100 when the cover 260 is in a closed position. Of course, it will be appreciated that the case 200 can also include means for securing the cover 260 in an open position in addition to or in lieu of the closure means. Again, snaps or magnets can be used to secure the cover 260 to a back side of the portable electronic device 100 when the cover 260 is in an open position.

In some embodiments, the portable electronic device 100 is capable of detecting a current position of the cover 260 when the portable electronic device 100 is secured in the case 200. As shown in FIG. 2, the case 200 can include a magnetic boosting device 250 carried within the cover 260 of the case 200. The magnetic boosting device 250 induces a magnetic field in proximity to the portable electronic device 100 that can be detected by a sensor 140 included in the portable electronic device 100. The magnitude of the magnetic field at a particular location within or proximate to the portable electronic device 100 is at or above a threshold value when the cover 260 is in a closed position. However, when the cover 260 is rotated to the open position, the magnitude of the magnetic field at the location drops below the threshold value as the magnetic boosting device 250 moves away from the particular location.

In some embodiments, the magnetic boosting device 250 includes at least two magnetic elements. The magnetic boosting device 250 can be included in the cover 260 of the case 200, such as by laminating the magnetic boosting device 250 between two layers of flexible material. In some embodiments, a thickness of each magnetic element in the magnetic boosting device 250 is less than either the length or width of the magnetic element. For example, an area of one side of the magnetic element can be on the order of 10-100 square millimeters whereas a thickness of the magnetic element measured in a direction normal to the one side is less than one millimeter. In other words, the magnetic elements in the magnetic boosting device 250 are thin. In some embodiments, the thickness of the magnets is reduced beyond a threshold thickness such that the magnets are flexible. It will be appreciated that very thin materials, even materials with relatively high compressive/tensile strength, can exhibit flexibility as long as the material is not brittle (cf., sheet steel vs. glass).

In some embodiments, each magnetic element in the magnetic boosting device 250 can be constructed by mixing a powder of ferrous metal or metal alloy with a resin and casting the resin and powder mixture in a mold of a particular shape to form a magnet blank. Once the resin has cured, the magnet blank is placed within a strong magnetic field induced by an electromagnet that causes the magnetic domains of the ferromagnetic particles cast in the resin to align in a general orientation along a magnetic pole axis that is substantially coaxial with the localized direction of the magnetic field induced by the electromagnet. In some embodiments, the temperature of the magnet blank can be raised above a threshold temperature during magnetization. It will be appreciated that the magnetic elements can be flexible due to the physical shape and size of the cast magnet blank as well as the material properties of the resin.

In other embodiments, each magnetic element in the magnetic boosting device 250 can be formed by forming a sheet of the resin and powder mixture of a particular thickness. The magnet blanks can then be produced from the cured sheet using a number of techniques such as by using a laser cutter, knife, or a punch press, among a number of other conventional manufacturing techniques. The magnet blanks are then subjected to an external magnetic field to magnetize the magnet blanks to form permanent magnets.

In yet other embodiments, each magnetic element in the magnetic boosting device 250 can be formed (e.g., forged, punched, etc.) or machined (e.g., milled, turned, etc.) from a ferrous metal or metal alloy such as Neodymium (Iron alloyed with Neodymium and Boron) or Alnico (Iron alloyed with Aluminum, Nickel, and Cobalt) to form a magnet blank. The magnet blanks can be formed or machined from a billet material or a sheet material. The magnet blanks are then subjected to an external magnetic field to magnetize the magnet blanks to form permanent magnets. Such magnetic elements machined or otherwise formed from a uniform ferrous metal or metal alloy material can be thinner than corresponding magnetic elements of similar strength formed from a ferrous powder cast in a resin. However, these magnetic elements can be more susceptible to fractures caused by bending than comparable magnetic elements cast in resin due to the material properties of the metal or metal alloy.

The magnetic poles associated with the magnetic elements in the magnetic boosting device 250 are aligned such that a strength of the magnetic field proximate one side of the cover 260 is stronger than a strength of the magnetic field proximate the opposite side of the cover 260. For example, as shown in FIG. 2, the magnitude of the magnetic field generated by the magnetic boosting device 250 on a first side of the cover 260 that is proximate the portable electronic device 100 when the cover 260 is in a closed position is stronger than the magnitude of the magnetic field of the magnetic boosting device 250 on a second side of the cover 260 that is opposite the portable electronic device 100 when the cover 260 is in the closed position. This may be referred to herein as a magnetic field that is asymmetrically disposed about the plane of the cover.

Figure 3:
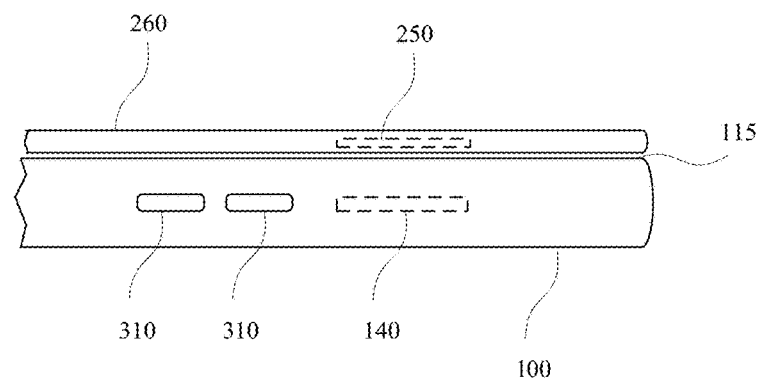
FIG. 3 is a side view of the portable electronic device and cover in a closed position, in accordance with some embodiments.

FIG. 3 is a side view of the portable electronic device 100 and cover 260 in a closed position, in accordance with some embodiments. As shown in FIG. 3, the portable electronic device 100 includes a pair of buttons 310 on one side of the housing 110. In the closed position, the cover 260 is proximate the front face 115 of the portable electronic device 100. The cover 260 also includes the magnetic boosting device 250 incorporated therein. For example, the magnetic boosting device 250 can be laminated between a first layer and a second layer of flexible material (e.g., silicone, rubber, leather, etc.) using adhesive. Alternatively, the magnetic boosting device 250 can be encapsulated in the cover 260 during a molding process in which an uncured material is injected into a mold with the magnetic boosting device 250 included therein, the material curing in the mold to encapsulate the magnetic boosting device 250.

The portable electronic device 100 includes a sensor 140 that can detect the presence, magnitude, and/or orientation of a magnetic field at a location of the sensor 140. The sensor 140 can determine whether a magnitude of a magnetic field at a location of the sensor 140 is at or greater than a threshold value. In other embodiments, the sensor 140 can measure the magnitude of the magnetic field, and a signal that represents the magnitude is transmitted to logic in the portable electronic device 100 that processes the signal to: (1) determine the magnitude of the magnetic field, and (2) perform one or more actions dependent thereon. For example, a processor included in the portable electronic device 100 can be configured to read the magnitude of the magnetic field from a memory and determine whether the cover 260 is in a closed position or an open position based on the level of the measured magnitude of the magnetic field. The processor can execute one or more instructions, stored in a memory of the portable electronic device 100, to implement the aforementioned actions. In other embodiments, the portable electronic device 100 can include a controller having logic that: (1) receives a signal from the sensor 140, and (2) processes the signal to determine a state of the cover 260 (e.g., whether the cover 260 is in an open position or a closed position).

In some embodiments, the portable electronic device 100 is configured to enter a power saving mode when the cover 260 is detected in the closed position. The power saving mode can include operations for: (1) power gating one or more logic units within a processor of the portable electronic device 100, (2) reducing a brightness of the display of the portable electronic device 100, (3) scaling an operating voltage or frequency of the processor of the portable electronic device 100, and/or (4) any other techniques to reduce the power consumption of one or more components included in the portable electronic device 100.

It will be appreciated that the thickness of the cover 260 is typically less than the thickness of the portable electronic device 100. For example, the portable electronic device 100 can be, e.g., 5-10 mm thick whereas the cover 260 is 1-2 mm thick. Given the thickness of the cover 260, the magnetic boosting device 250 could be less than 1 mm thick, in various embodiments. The magnitude of the magnetic field of a conventional permanent magnet having a magnetic pole axis oriented normal to the front face 115 of the portable electronic device 100 and positioned as far as 5 mm away from the sensor 140 could be insufficient to trigger the detection of the cover 260. Therefore, techniques for boosting the magnitude of the magnetic field can be incorporated into the magnetic boosting device 250 in order to increase the signal to noise ratio of the signal measured by the sensor 140.

Although the cover 260 shown in FIG. 3 is included as part of the case 200, which can be integrated with or otherwise separated from the portable electronic device 100 in different embodiments, it will be appreciated that the portable electronic device 100 can incorporate some aspects of the case 200 into the portable electronic device 100 itself. For example, in some embodiments, the portable electronic device 100 includes a protective cover configured to overlap the extents of the display 120 when the protective cover is in the closed position. The protective cover can include the magnetic boosting device 250 and operate similar to cover 260 of the case 200 even though the protective cover is implemented within the portable electronic device 100 and not separable therefrom.

Figure 4A:
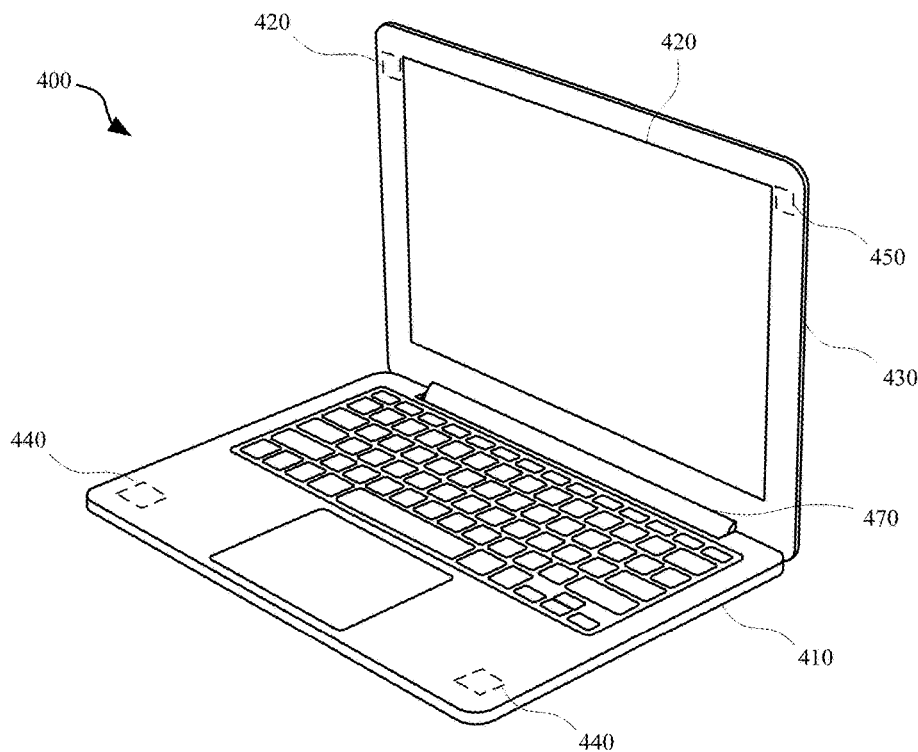
FIGS. 4A & 4B illustrate a portable electronic device with a protective cover, in accordance with some embodiments.
Figure 4B:
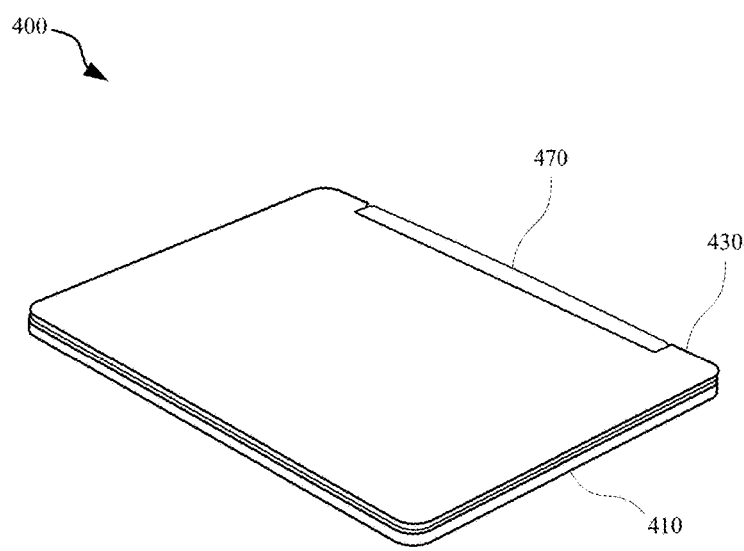

FIGS. 4A & 4B illustrate a portable electronic device 400, in accordance with some embodiments. The portable electronic device 400 is a laptop computer that includes a base portion 410 connected to an upper portion 430 via a hinge assembly 470. The base portion 410 can include various electronic components such as a processor, memory, hard disc drive, solid state drive, touchpad, keyboard, audio components, and the like. The base portion 410 can also include one or more sensors 440, each sensor similar to sensor 140, that are configured to measure the magnitude and/or orientation of a magnetic field at the location of the sensor 440. The upper portion 430 can include a display 420 as well as one or more magnetic boosting devices 450.

As shown in FIG. 4A, the portable electronic device 400 can be utilized by a user in a normal mode while the upper portion 430 is in an open position relative to the base portion 410. The magnetic boosting devices 450 are located a relatively long distance from the sensors 440 when the portable electronic device 400 is in the open position. A shown in FIG. 4B, the user can rotate the upper portion 430 around the hinge assembly 470 to place the upper portion 430 in a closed position relative to the base portion 410. In the closed position, the upper portion 430 functions as a protective cover for the display 420. More specifically, the display 420 included in the upper portion 430 is protected when the upper portion 430 is placed proximate the base portion 410 in the closed position. In addition, the magnetic boosting devices 450 are brought relatively close to the sensors 440 in the closed position, thereby increasing the magnetic field at the location of the sensors 440. It will be appreciated that utilizing multiple sensors 440 and multiple magnetic boosting devices 450 can help reduce a false trigger signal caused by a separate magnet being brought close to a sensor 440. Alternatively, the base portion 410 functions as a protective cover for the display 420. In such embodiments, the magnetic boosting devices 450 can be included in the base portion 410 and the sensors 440 can be included in the upper portion 430. In such embodiments, signals from the sensors 440 are routed from the upper portion 430 to the base portion 410 through the hinge assembly 470 such that the signals can be interfaced with a processor or controller in the base portion 410.

Figure 5A:
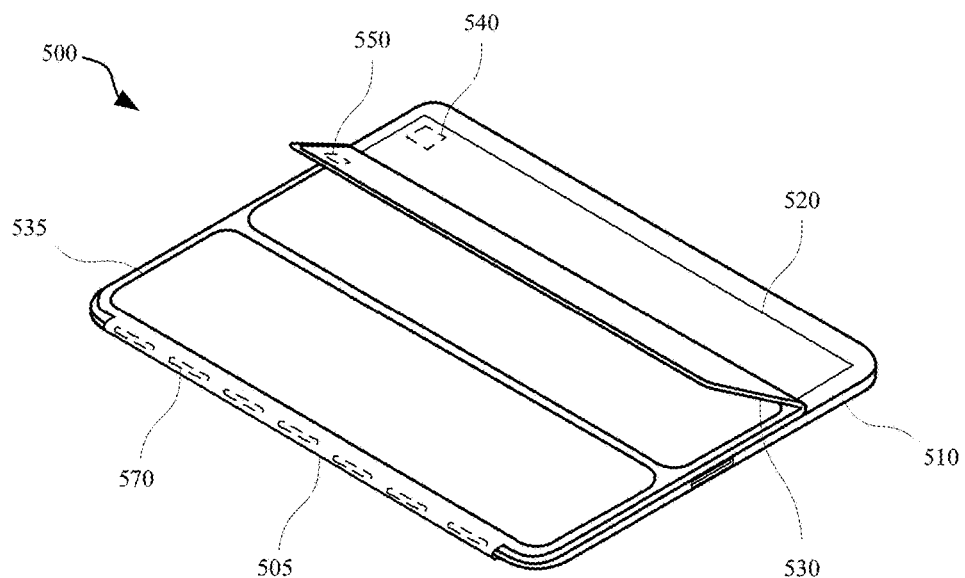
FIGS. 5A & 5B illustrate a case for a portable electronic device, in accordance with some embodiments.
Figure 5B:
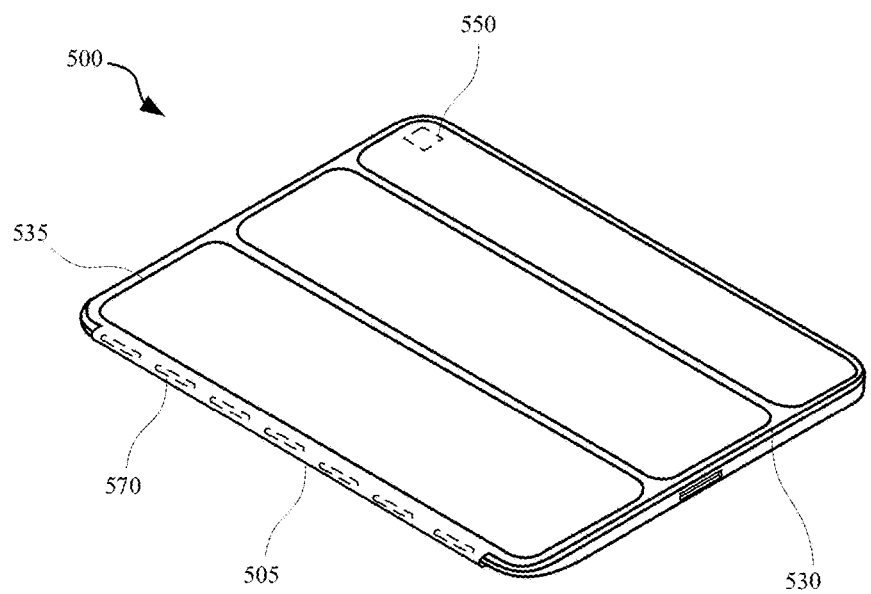

FIGS. 5A & 5B illustrate a case 505 for a portable electronic device 500, in accordance with some embodiments. The portable electronic device 500 is a tablet computer that includes a display 520 secured in a housing 510. The case 505 includes a cover 530 having a plurality of segments 535. Each segment is coupled to an adjacent segment via a flexible material that enables the segment to rotate relative to the adjacent segment. In some embodiments, the cover 530 is constructed by laminating rigid members between two or more layers of a flexible material. For example, the rigid members can be constructed of a plastic material and the flexible material can be a silicone or rubber material. As shown in FIG. 5A, the cover 530 can include three segments 535, although a greater or fewer number of segments are contemplated as within the scope of the case 505.

In some embodiments, the case 505 can be secured to the portable electronic device 500 via a magnetic array 570 that is attached to one side of the portable electronic device 500. The magnetic array 570 can form a magnetic circuit with corresponding magnets embedded within the housing 510 of the portable electronic device 500. Alternatively, the magnetic array 570 can form a magnetic circuit with ferrous material embedded within the housing 510 of the portable electronic device 500. For example, the housing 510 can include an inlay of steel material. Consequently, the case 505 is secured to the portable electronic device 500 at one edge of the housing of the portable electronic device 500 and the cover 530 of the case 505 can protect the display 520 when the cover 530 is in a closed position.

The case 505 also includes a magnetic boosting device 550 embedded in the cover 530. The magnetic boosting device 550 can be laminated between two layers of flexible material at a location in the cover 530 that is proximate a sensor 540 included in the portable electronic device 500. The sensor 540 is configured to measure a magnitude of the magnetic field at a location of the sensor 540 in order to determine a state of the case 505 (e.g., whether the case is in an open position or a closed position). In some embodiments, the case 505 includes multiple magnetic boosting devices 550, and the portable electronic device 500 includes multiple corresponding sensors 540. For example, each of the segments 535 of the case can include a separate and distinct magnetic boosting device 550 such that multiple sensors 540 in the portable electronic device 500 can be configured to determine a state of each segment 535 in the cover 530 of the case 505. More specifically, each sensor 540 in multiple sensors can determine whether a corresponding segment 535 of the cover 530 is flat against the display 520 or is rotated back away from the display 520 and toward the magnetic array 570 at one edge of the portable electronic device 500.

Although FIGS. 1-5B describe various portable electronic devices including a mobile phone, a laptop computer, and a tablet computer, nothing in this detailed description should be construed as being limited to those particular embodiments of an electronic device. For example, various embodiments can be realized as providing a case or protective cover for a digital camera, printer, television, gaming console, and the like.

Figure 6A:
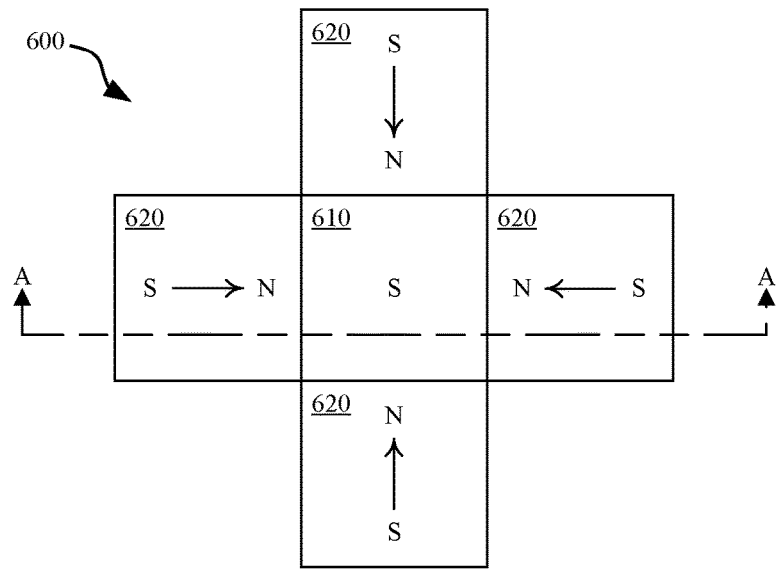
FIGS. 6A & 6B illustrate a magnetic boosting device, in accordance with some embodiments.
Figure 6B:
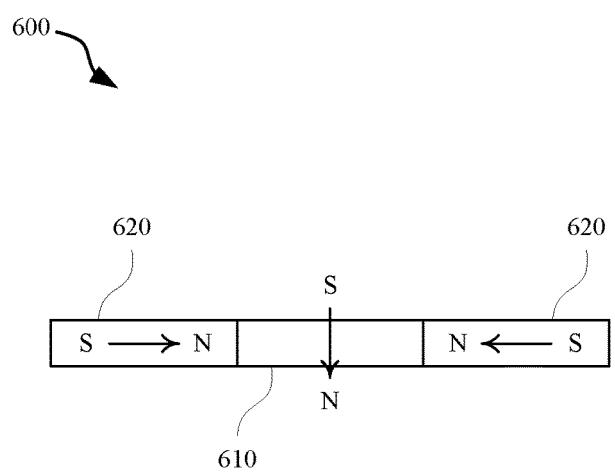

FIGS. 6A & 6B illustrate a magnetic boosting device 600, in accordance with some embodiments. The magnetic boosting device 600 can be included within the cover 260 of case 200 as magnetic boosting device 250, included within the portable electronic device 400 as magnetic boosting device 450, or included within the case 505 as magnetic boosting device 550. The magnetic boosting device 600 includes a layer of magnetic elements including at least one primary magnetic element and at least one additional secondary magnetic element. The orientations of the magnetic poles for each of the magnetic elements included in the magnetic boosting device 600 are arranged to boost the magnitude of the magnetic field on one side of the magnetic boosting device 600 and reduce the magnitude of the magnetic field below a threshold value on the other side of the magnetic boosting device 600. A sensor (e.g., sensor 140, sensor 440, or sensor 540, etc.) will only detect the presence of the magnetic field when the magnetic boosting device 600 is oriented in a particular direction relative to the sensor. Varying the strength of the magnetic field based on the orientation of the magnetic boosting device 600 enables magnetic boosting device 600 to be placed proximate the sensor in a reverse orientation without the sensor detecting the magnetic field induced by the magnetic boosting device 600. This is particularly relevant when the magnetic boosting device 600 is incorporated into a case that includes a cover that can be folded behind an electronic device when the cover is in an open position.

As shown in FIG. 6A, a top view of the magnetic boosting device 600 indicates that the magnetic boosting device 600 includes a layer of magnetic elements including: a primary magnetic element 610 and one or more secondary magnetic elements 620. The primary magnetic element 610 and secondary magnetic elements 620 can be rectangular in shape, with each of four secondary magnetic elements 620 being arranged adjacent to a corresponding side of the primary magnetic element 610. In some embodiments, a thickness of the primary magnetic element 610 is less than both the length and width of the primary magnetic element 610 in the other dimensions. For example, the dimensions of the primary magnetic element 610 can be 10 mm×10 mm×1 mm (l×w×t), which may be referred to herein as a thin magnet with a square cross-sectional shape. The secondary magnetic elements 620 can have similar dimensions to the primary magnetic element 610. In some embodiments, the length dimension and width dimension are not uniform on all sides of the magnetic elements (e.g., the magnetic elements can be rectangular instead of square). In other embodiments, the primary magnetic element 610 can have a square cross-sectional shape while the secondary magnetic elements 620 can have a rectangular cross-sectional shape.

An axis of orientation of the magnetic poles associated with the primary magnetic element 610 can be substantially coaxial with a surface normal of the face having the greatest area (e.g., in the direction of the thickness dimension). As used herein, the term "substantially coaxial" means that the axis of orientation of the magnetic poles and the surface normal do not need to be strictly coaxial, but will be generally coaxial within some deviation such as 15 degrees from coaxial. For example, the magnetic poles of the primary magnetic element 610 can be oriented such that the north pole is oriented towards a first face of the primary magnetic element 610 and the south pole is oriented towards a second face of the primary magnetic element 610, where the first face and second face are located on opposite sides of the primary magnetic element 610 and correspond to the faces with the greatest area.

In contrast, the axis of orientation the magnetic poles associated with the secondary magnetic elements 620 are aligned orthogonally to the axis of orientation of the magnetic poles of the primary magnetic element 610 when the primary magnetic element 610 and secondary magnetic elements 620 are arranged as shown in FIG. 6A. In other words, the magnetic poles associated with each secondary magnetic element 620 are oriented parallel to the face of the secondary magnetic element 620 having the greatest area. As shown in FIG. 6A, the axis of orientation of the magnetic poles for each secondary magnetic element 620 is pointing at the primary magnetic element 610 in a direction substantially perpendicular to the adjacent face of the primary magnetic element 610. It will be appreciated that, in some embodiments, the axis of orientation of the magnetic poles associated with the secondary magnetic elements 620 is not exactly orthogonal to the axis of orientation of the magnetic poles of the primary magnetic element 610 within some deviation from ninety degrees (e.g., plus or minus 15 degrees).

FIG. 6B is a section view of the magnetic boosting device 600 along section A-A of FIG. 6A. FIG. 6B illustrates the orthogonal arrangement of the axis of orientation of the magnetic poles for the primary magnetic element 610 and two secondary magnetic elements 620. The shapes of the primary magnetic element 610 and the secondary magnetic elements 620 are further illustrated in FIG. 6B. Again, the thickness of the magnetic elements is less than the length or width of the magnetic elements as illustrated in FIG. 6A. In some embodiments, the thickness of the magnetic elements is at least an order of magnitude smaller than the length or width of the magnetic elements. Such magnetic elements can be flexible due to their physical structure and material properties.

Again, the shape of the primary magnetic element 610 can be square (e.g., where the length is equal to the width of the primary magnetic element 610) or rectangular (e.g., where the length is greater than the width of the primary magnetic element 610). The corresponding secondary magnetic elements 620 are then sized appropriately such that at least one dimension of a secondary magnetic element 620 matches the dimension of a corresponding side of the primary magnetic element 610 adjacent thereto. In other embodiments, the shape of the primary magnetic element 610 can be something other than rectangular. For example, the primary magnetic element 610 can be triangular, pentagonal, hexagonal, and the like. In such embodiments, the number of secondary magnetic elements 620 included in the magnetic boosting device 600 can be equal to the number of sides of the primary magnetic element 610.

In other embodiments, the number of secondary magnetic elements 620 does not match the number of sides of the primary magnetic element 610. For example, as shown in FIGS. 6A & 6B, the number of secondary magnetic elements 620 can be reduced from four to two, such that the magnetic boosting device 600 only includes a pair of secondary magnetic elements 620 arranged on opposite sides of the primary magnetic element 610. In some embodiments, the shape of the primary magnetic element 610 can be rectangular with a length dimension being much greater than a width dimension, and the shape of the secondary magnetic elements 620 can share the length dimension with the primary magnetic element 610 and be arranged adjacent to the long sides of the primary magnetic element 610. In other embodiments, such as embodiments where the primary magnetic element 610 has a hexagonal or octagonal shape, the magnetic boosting device 600 can also have a reduced number of secondary magnetic elements 620. For example, a magnetic boosting device 600 where the primary magnetic element 610 is hexagonal can include three secondary magnetic elements 620 instead of six, each secondary magnetic element 620 arranged adjacent to every other side of the primary magnetic element 610.

It will be appreciated that the primary magnetic element 610 and secondary magnetic elements 620 will experience a torque due to being placed in a magnetic field that is not aligned to the magnetic moment for that magnet. Thus, the primary magnetic element 610 and secondary magnetic elements 620 should be retained by some means that prevents the magnetic elements from changing alignment in the magnetic boosting device 600. In some embodiments, the secondary magnetic elements 620 are glued to the primary magnetic element 610 using an adhesive. The adhesive can have sufficient strength to prevent the magnetic elements from rotating relative to the other magnetic elements. In other embodiments, the primary magnetic element 610 and secondary magnetic elements 620 are laminated between other materials, such as layers of flexible material in the cover 260, which prevents relative movement of the magnetic elements. In yet other embodiments, the primary magnetic element 610 and secondary magnetic elements 620 are encased within a housing (not explicitly shown) that prevents relative movement of the magnetic elements. For example, the magnetic elements can be encased in a plastic material after being magnetized that prevents relative movement of the magnetic elements. Alternatively, the magnetic elements can be press fit or glued into a housing that secures the magnetic elements. The housing can be aluminum, ceramic, plastic, wood, or some other material sufficient to retain the magnetic elements.

In some embodiment, the thickness of the primary magnetic element 610 is not the same as the thickness of the secondary magnetic elements 620. For example, each of the secondary magnetic elements 620 could be thinner or thicker than the primary magnetic element 610. It will be appreciated that the characteristics of the primary magnetic element 610 and/or secondary magnetic elements 620 can be tuned to adjust the resultant magnetic field associated with the magnetic boosting device 600. The ratio of the thicknesses of the primary magnetic element 610 and the secondary magnetic elements 620, the ratio of ferromagnetic powder to resin in the primary magnetic element 610 and/or secondary magnetic elements 620, and the relative lengths and widths of the primary magnetic element 610 and secondary magnetic elements 620 can all be tuned in order to adjust the strength of the resultant magnetic field on each side of the magnetic boosting device 600, as will be discussed in more detail below.

Figure 7A:
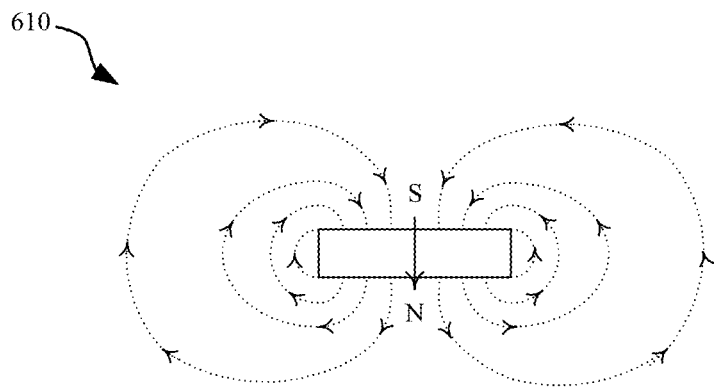
FIG. 7A illustrates the magnetic field corresponding to the primary magnetic element of the magnetic boosting device, in accordance with some embodiments.

FIG. 7A illustrates the magnetic field corresponding to the primary magnetic element 610 of the magnetic boosting device 600, in accordance with some embodiments. As shown in FIG. 7A, the primary magnetic element 610 is associated with a magnetic field (e.g., a vector field, where each vector at a particular location represents the magnitude and orientation of the magnetic force at that location), which is represented by continuous magnetic field lines running from the north pole to the south pole of the primary magnetic element 610. The magnetic field inside the primary magnetic element 610 is substantially parallel to the axis of orientation of the magnetic poles of the primary magnetic element 610; however, the magnetic field outside the primary magnetic element 610 runs from the north pole of the primary magnetic element 610 to the south pole of the primary magnetic element 610 in a continuous curve such that the orientation of the magnetic field outside the primary magnetic element 610 is not necessarily parallel with the axis of orientation of the magnetic poles of the primary magnetic element 610. The strength of the magnetic field, B, at any given point is inversely proportional to the distance between field lines at that point and, generally, decreases as the distance from the primary magnetic element 610 increases.

Figure 7B:
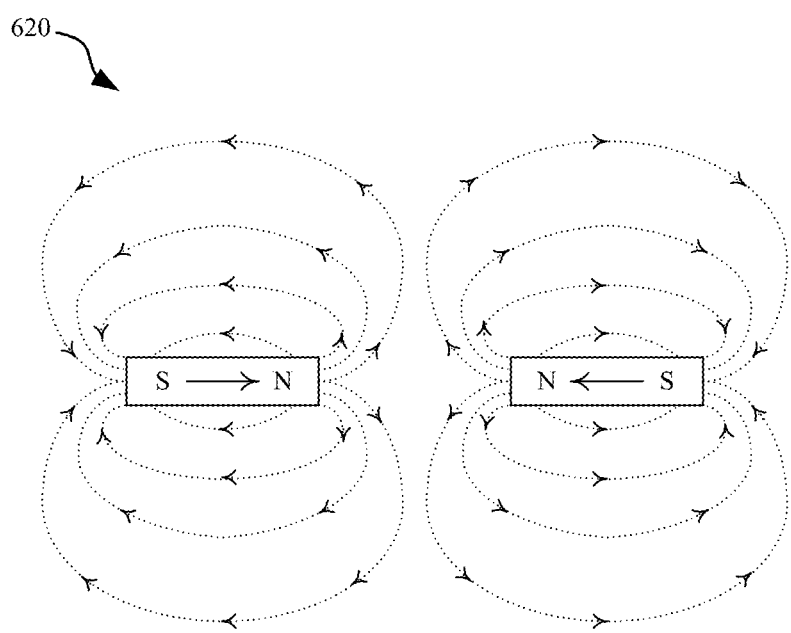
FIG. 7B illustrates the magnetic field corresponding to the secondary magnetic element of the magnetic boosting device, in accordance with some embodiments.

FIG. 7B illustrates the magnetic field corresponding to the secondary magnetic elements 620 of the magnetic boosting device 600, in accordance with some embodiments. As shown in FIG. 7B, a pair of secondary magnetic elements 620 are separated by a distance, d, and aligned such that the adjacent sides of the secondary magnetic elements 620 correspond to like poles (e.g., the north pole of a first magnetic element is placed proximate the north pole of a second magnetic element). In this alignment, the pair of secondary magnetic elements 620 will repel each other by a force proportional to the strength of the magnetic field of the secondary magnetic elements 620 and inversely proportional to the distance, d.

It will be appreciated that only two of the four secondary magnetic elements 620 are illustrated in FIG. 7B. The other two secondary magnetic elements 620 are arranged at ninety degrees to the pair of secondary magnetic elements 620 shown in FIG. 7B. The magnetic field associated with those two secondary magnetic elements 620 will be substantially similar to the magnetic field shown in FIG. 7B rotated ninety degrees, and the magnetic fields can be combined using principles of superposition to visualize the resultant magnetic field of all four secondary magnetic elements 620 of the magnetic boosting device 600.

Figure 7C:
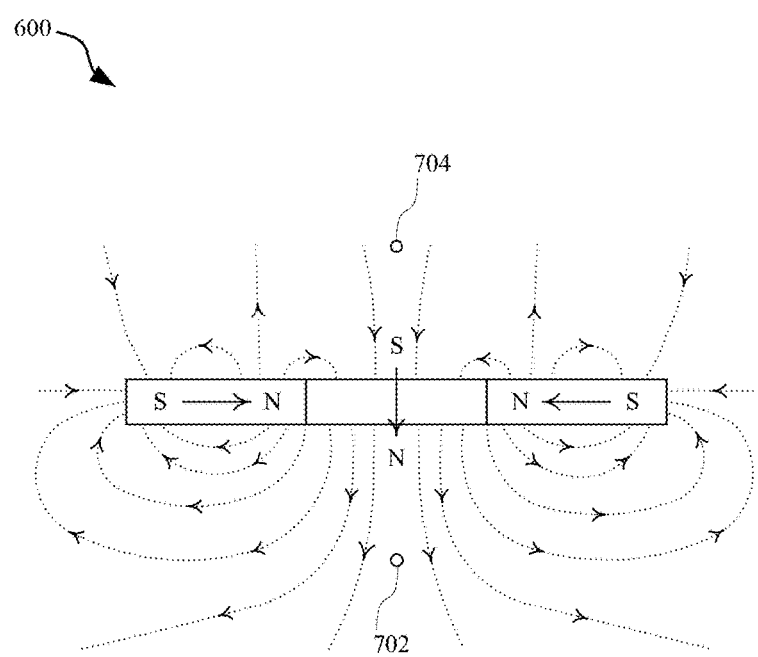
FIG. 7C illustrates the resultant magnetic field corresponding to the magnetic boosting device, in accordance with some embodiments.

FIG. 7C illustrates the resultant magnetic field corresponding to the magnetic boosting device 600, in accordance with some embodiments. A first magnetic field provided by the primary magnetic element 610 is combined with the magnetic fields provided by the four secondary magnetic elements 620 to provide the resultant magnetic field of the magnetic boosting device 600. By arranging the secondary magnetic elements 620 on either side of the primary magnetic element 610 in the magnetic boosting device 600, the resultant magnetic field is boosted on a first side of the magnetic boosting device 600 and suppressed on a second side of the magnetic boosting device 600, where the second side is opposite the first side. In the case where the north poles of the secondary magnetic elements 620 are arranged closer to the primary magnetic element 610, the magnitude of the resultant magnetic field on the side of the magnetic boosting device 600 corresponding to the north pole of the primary magnetic element 610 is increased, and the magnitude of the resultant magnetic field on the opposite side of the magnetic boosting device 600 corresponding to the south pole of the primary magnetic element 610, is decreased. Alternatively, in the case where the south poles of the secondary magnetic elements 620 are arranged closer to the primary magnetic element 610, the magnitude of the resultant magnetic field on the side of the magnetic boosting device 600 corresponding to the south pole of the primary magnetic element 610 is increased, and the magnitude of the resultant magnetic field on the opposite side of the magnetic boosting device 600 corresponding to the north pole of the primary magnetic element 610 is decreased.

The effect on the resultant magnetic field by combining the primary magnetic element 610 with the secondary magnetic elements 620 becomes apparent by visualizing the orientation of the magnetic fields associated with the primary magnetic element 610 and the secondary magnetic elements 620 at locations on either side of the magnetic boosting device 600 proximate the primary magnetic element 610. The direction of the magnetic fields for both the primary magnetic element 610 and secondary magnetic elements 620 generally align on one side of the magnetic boosting device 600 and generally oppose on the other side of the magnetic boosting device 600.

In some embodiments, the characteristics of the secondary magnetic elements 620 can be tuned to reduce the magnitude of the magnetic field at a particular point on one side of the magnetic boosting device 600 below a threshold value. For example, as shown in FIG. 7C, a first point 702 on a first side of the magnetic boosting device 600 experiences an increase in the magnitude of the resultant magnetic field when the secondary magnetic elements 620 are combined with the primary magnetic element 610 compared to the magnitude of a component of the magnetic field from the primary magnetic element 610 alone. In contrast, a second point 704 on a second side of the magnetic boosting device 600 experiences a decrease in the magnitude of the resultant magnetic field when the secondary magnetic elements 620 are combined with the primary magnetic element 610 compared to the magnitude of a component of the magnetic field from the primary magnetic element 610 alone. The strength of the resultant magnetic field at point 704 can be decreased below a threshold value by tuning the dimensions of the secondary magnetic elements 620 relative to the primary magnetic element 610, adjusting the ratio of resin to ferromagnetic powder in the secondary magnetic elements 620 relative to the primary magnetic element 610, and/or changing the type of ferromagnetic material in the secondary magnetic elements 620 relative to the primary magnetic element 610.

In some embodiments, the characteristics of the secondary magnetic elements 620 are tuned such that there is no detectable magnetic field at point 704. It will be appreciated that the characteristics of the secondary magnetic elements 620 cannot be tuned sufficiently to reduce the resultant magnetic field to zero at every point on one side of the magnetic boosting device 600. Instead, the characteristics of the secondary magnetic elements 620 can only be tuned to reduce the resultant magnetic field at a particular point below a threshold value, where the threshold value can be sufficiently close to zero for the particular point.

This becomes obvious when visualizing a plurality of points offset along the top side of the magnetic boosting device 600 in FIG. 7C. From left to right across the magnetic boosting device 600, the magnetic field is initially oriented down at the left edge of the first secondary magnetic element 620 (toward the south pole of the first secondary magnetic element 620), rotates 180 degrees to point up (away from the north pole of the first secondary magnetic element 620), rotates 180 degrees to point down (toward the south pole of the primary magnetic element 610) near the center of the magnetic boosting device 600, rotates 180 degrees to point up (away from the north pole of the second secondary magnetic element 620), and then rotates 180 degrees to point down at the right edge of the second secondary magnetic element 620 (toward the south pole of the second secondary magnetic element 620). The fluctuation between north and south poles of the secondary magnetic elements 620 and primary magnetic element 610 on this side of the magnetic boosting device 600 in close proximity reduces the magnitude of the magnetic field at any point on this side of the magnetic boosting device 600 because the superposition of magnetic fields induced by the secondary magnetic elements 620 counteract the magnetic field induced by the primary magnetic element 610. Still, for points very close to a particular magnetic element, the strength of the magnetic field from that magnetic element will be much stronger than the counteracting effects of the magnetic fields from the other magnetic elements due to the difference in relative distance between that point and the various magnetic elements in the magnetic boosting device 600. Thus, it is only possible to decrease the resultant magnetic field to zero at a particular point (or at least reduce the magnitude of the resultant magnetic field substantially close to zero where detection of a magnetic field is impossible given the sensitivity of a particular measurement device).

Performing the visualization of a plurality of points offset along the bottom side of the magnetic boosting device 600 in FIG. 7C is also useful to understand how the magnetic boosting device 600 boosts the resultant magnetic field at point 702. From left to right across the magnetic boosting device 600, the magnetic field is initially oriented up at the left edge of the first secondary magnetic element 620 (toward the south pole of the first secondary magnetic element 620), rotates 180 degrees to point down (away from the north pole of the first secondary magnetic element 620), continues to point down near the center of the magnetic boosting device 600 (away from the north pole of the primary magnetic element 610), continues to point down (away from the north pole of the second secondary magnetic element 620), and then rotates 180 degrees to point up at the right edge of the second secondary magnetic element 620 (toward the south pole of the second secondary magnetic element 620). Given that the only fluctuation between north and south poles occur at the edges of the magnetic boosting device 600, it is easy to see how the resultant magnetic field is increased at point 702 due to the superposition of substantially aligned magnetic fields from the primary magnetic element 610 and secondary magnetic elements 620 at point 702.

Figure 8A:
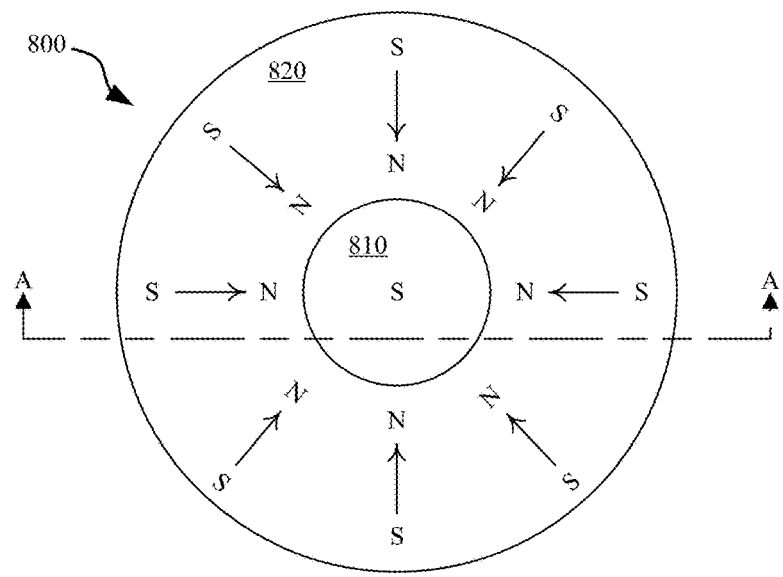
FIGS. 8A & 8B illustrate a magnetic boosting device, in accordance with some embodiments.
Figure 8B:
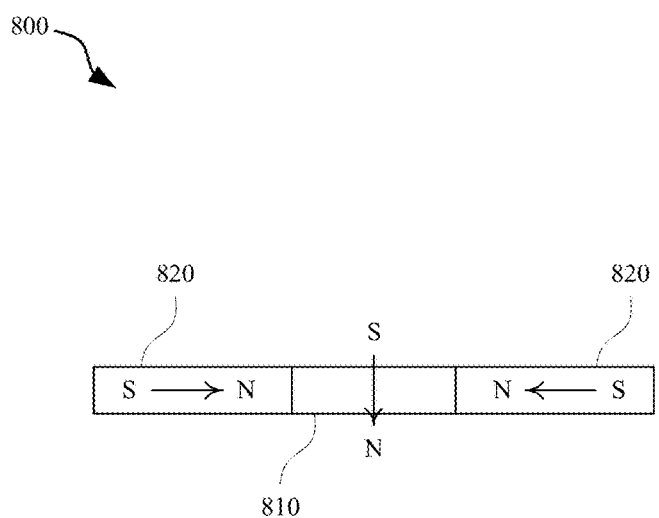

FIGS. 8A & 8B illustrate a magnetic boosting device 800, in accordance with some embodiments. The magnetic boosting device 800 can be included within the cover 260 of case 200 as magnetic boosting device 250, included within the portable electronic device 400 as magnetic boosting device 450, or included within the case 505 as magnetic boosting device 550. As shown in FIG. 8A, the magnetic boosting device 800 includes a layer of magnetic elements including: a cylindrical primary magnetic element 810 and a hollow cylindrical secondary magnetic element 820. It will be appreciated that the primary magnetic element 810 is similar to primary magnetic element 610 other than having a circular cross-sectional shape instead of a rectangular cross-sectional shape. The thickness of the primary magnetic element 810 is less than a diameter of the primary magnetic element 810. In some embodiments, the thickness of the primary magnetic element 810 is at least an order of magnitude less than the diameter of the primary magnetic element 810. For example, the diameter of the primary magnetic element 810 can be 10 mm while the thickness of the primary magnetic element 810 is less than 1 mm.

The axis of orientation of the magnetic poles of the primary magnetic element 810 can be substantially coaxial with a surface normal of the face of the cylinder having the greatest area. For example, the axis of orientation of the magnetic poles of the primary magnetic element 810 can be oriented such that the north pole of the primary magnetic element 810 is oriented towards a first face of the primary magnetic element 810 and the south pole of the primary magnetic element 810 is oriented towards a second face of the primary magnetic element 810, where the first face and second face are the round faces of the cylinder that are located on opposite sides of the primary magnetic element 810. In other words, the magnetic poles of the primary magnetic element 810 can be aligned with the central axis of the cylinder of the primary magnetic element 810.

In contrast, the magnetic poles of the secondary magnetic element 820 are oriented radially. In other words, one pole of the secondary magnetic element 820 is oriented towards the exterior surface of the hollow cylinder and the other pole of the secondary magnetic element 820 is oriented towards the interior surface of the hollow cylinder. As shown in FIG. 8A, the magnetic poles for the secondary magnetic element 820 are pointing toward a central axis of the cylinder of the primary magnetic element 810 when the primary magnetic element 810 is arranged inside the hollow cylinder of the secondary magnetic element 820. It will be appreciated that the secondary magnetic element 820 can be referred to as a ring magnet.

FIG. 8B is a section view of the magnetic boosting device 800 along section A-A of FIG. 8A that illustrates the orthogonal arrangement of the magnetic poles for the primary magnetic element 810 and the secondary magnetic element 820. Again, the thickness of the magnetic elements is less than the outer diameter of the magnetic elements as illustrated in FIG. 8A. Similar to the magnetic boosting device 600 as illustrated in FIGS. 6A & 6B, the magnetic boosting device 800 as illustrated in FIGS. 8A & 8B increases the magnitude of the resultant magnetic field on one side of the primary magnetic element 810, and decreases the magnitude of the resultant magnetic field below a threshold value on the opposite side of the primary magnetic element 810.

Figure 9A:
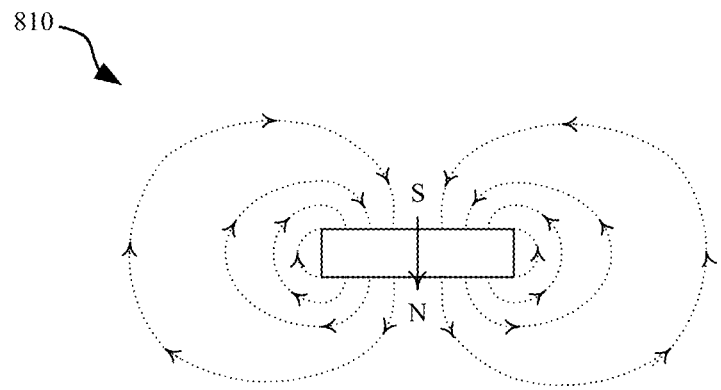
FIG. 9A illustrates the magnetic field corresponding to the primary magnetic element of the magnetic boosting device, in accordance with some embodiments.

FIG. 9A illustrates the magnetic field corresponding to the primary magnetic element 810 of the magnetic boosting device 800, in accordance with some embodiments. The magnetic field of the primary magnetic element 810 is radially symmetrical around a central axis of the cylinder of the primary magnetic element 810. The magnetic field is substantially parallel to a central axis of the cylinder inside the primary magnetic element 810, and wraps around the cylinder from a first circular face to a second circular face outside the primary magnetic element 810.

Figure 9B:
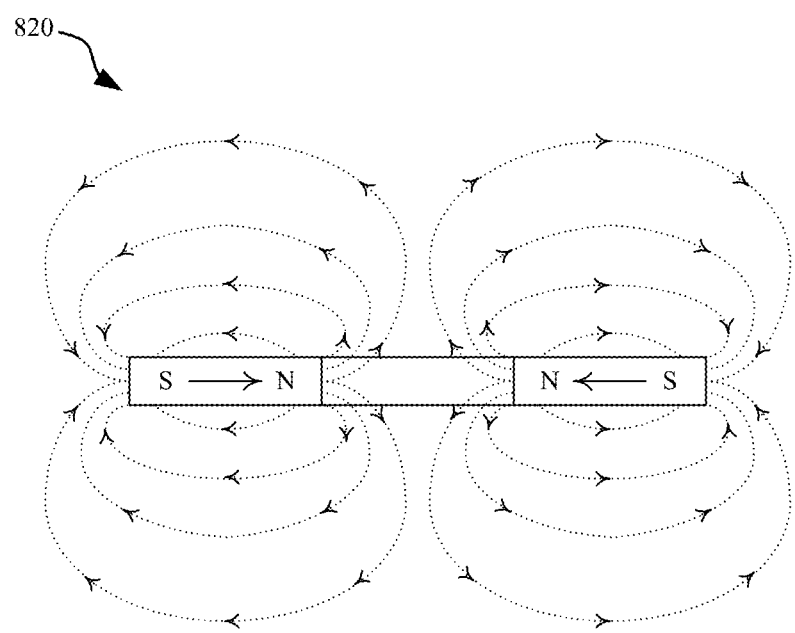
FIG. 9B illustrates the magnetic field corresponding to the secondary magnetic element of the magnetic boosting device, in accordance with some embodiments.

FIG. 9B illustrates the magnetic field corresponding to the secondary magnetic element 820 of the magnetic boosting device 800, in accordance with some embodiments. The magnetic field of the secondary magnetic element 820 is radially symmetrical around a central axis of the hollow cylinder of the secondary magnetic element 820. The magnetic field is aligned radially inside the secondary magnetic element 820 and wraps around the cylinder from the inside face of the hollow cylinder to the outside face of the hollow cylinder outside the secondary magnetic element 820.

Figure 9C:
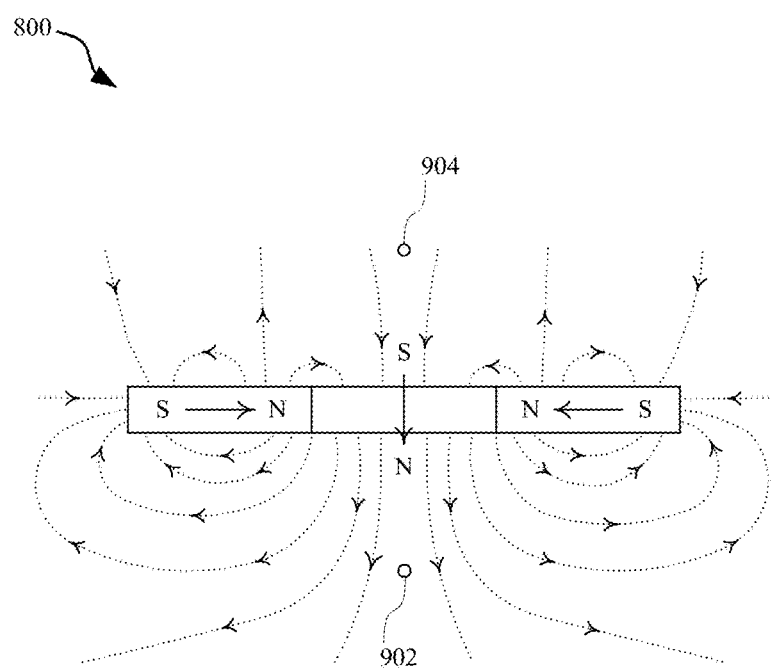
FIG. 9C illustrates the resultant magnetic field corresponding to the magnetic boosting device, in accordance with some embodiments.

FIG. 9C illustrates the resultant magnetic field corresponding to the magnetic boosting device 800, in accordance with some embodiments. By arranging the secondary magnetic element 820 to surround the primary magnetic element 810 in the magnetic boosting device 800, the resultant magnetic field is boosted on a first side of the primary magnetic element 810 and suppressed on a second side of the primary magnetic element 810, where the second side is opposite the first side. In the case where the north pole of the secondary magnetic element 820 is arranged closer to the primary magnetic element 810, the magnitude of the resultant magnetic field on the side of the magnetic boosting device 800 corresponding to the north pole of the primary magnetic element 810 is increased, and the magnitude of the resultant magnetic field on the opposite side of the magnetic boosting device 800 corresponding to the south pole of the primary magnetic element 810 is decreased. Alternatively, in the case where the south pole of the secondary magnetic element 820 is arranged closer to the primary magnetic element 810, the magnitude of the resultant magnetic field on the side of the magnetic boosting device 800 corresponding to the south pole of the primary magnetic element 810 is increased, and the magnitude of the resultant magnetic field on the opposite side of the magnetic boosting device 800 corresponding to the north pole of the primary magnetic element 810 is decreased.

The effect on the resultant magnetic field by combining the primary magnetic element 810 with the secondary magnetic element 820 becomes apparent by visualizing the orientation of the magnetic fields associated with the primary magnetic element 810 and the secondary magnetic element 820 at locations on either side of the magnetic boosting device 800 proximate the primary magnetic element 810. The direction of the magnetic fields for both the primary magnetic element 810 and secondary magnetic element 820 generally align on one side of the magnetic boosting device 800 and generally oppose on the other side of the magnetic boosting device 800, similar to how the magnetic fields associated with the primary magnetic element 610 and secondary magnetic elements 620 generally align or oppose on opposite sides of the magnetic boosting device 600.

In some embodiments, the characteristics of the secondary magnetic element 820 can be tuned to reduce the magnitude of the resultant magnetic field at a particular point on one side of the magnetic boosting device 800 below a threshold value. For example, as shown in FIG. 9C, a first point 902 on a first side of the magnetic boosting device 800 experiences an increase in the magnitude of the resultant magnetic field when the secondary magnetic element 820 is combined with the primary magnetic element 810 compared to the magnitude of a component of the magnetic field from the primary magnetic element 810 alone. In contrast, a second point 904 on a second side of the magnetic boosting device 800 experiences a decrease in the magnitude of the resultant magnetic field when the secondary magnetic element 820 is combined with the primary magnetic element 810 compared to the magnitude of a component of the magnetic field from the primary magnetic element 810 alone. The strength of the resultant magnetic field at point 904 can be decreased below a threshold value by tuning the dimensions of the secondary magnetic element 820 relative to the primary magnetic element 810, adjusting the ratio of resin to ferromagnetic powder in the secondary magnetic element 820 relative to the primary magnetic element 810, and/or changing the type of ferromagnetic material in the secondary magnetic element 820 relative to the primary magnetic element 810.

In some embodiments, the characteristics of the secondary magnetic element 820 are tuned such that there is no detectable magnetic field at point 904. It will be appreciated that the characteristics of the secondary magnetic element 820 cannot be tuned sufficiently to reduce the resultant magnetic field to zero at every point on one side of the magnetic boosting device 800. Instead, the characteristics of the secondary magnetic element 820 can only be tuned to reduce the magnitude of the resultant magnetic field at a particular point below a threshold value, where the threshold value is sufficiently close to zero for the particular point.

It will be appreciated that the resultant magnetic field above or below the magnetic boosting device 800 fluctuates in much the same manner as the resultant magnetic field above or below the magnetic boosting device 600, described above in conjunction with FIG. 7C, except that the fluctuation of the resultant magnetic field is symmetrical over any radial direction that passes through the central axis of the cylinder of the primary magnetic element 810 where the primary magnetic element 810 and secondary magnetic element 820 are coaxial. In contrast, the fluctuation of the resultant magnetic field of magnetic boosting device 600 is only symmetrical around a plane that bisects the primary magnetic element 610 and is parallel to either the length dimension or the width dimension of the primary magnetic element 610. In other words, the geometry of the cross-sectional shape of the primary magnetic element and secondary magnetic element(s) in the magnetic boosting devices 600 & 800 determine the symmetry of the resultant magnetic field. However, the resultant magnetic fields associated with magnetic boosting devices 600 and 800 are similar in that the magnitude of the resultant magnetic field is increased on one side of the primary magnetic element and decreased on the other side of the primary magnetic element.

Figure 10:
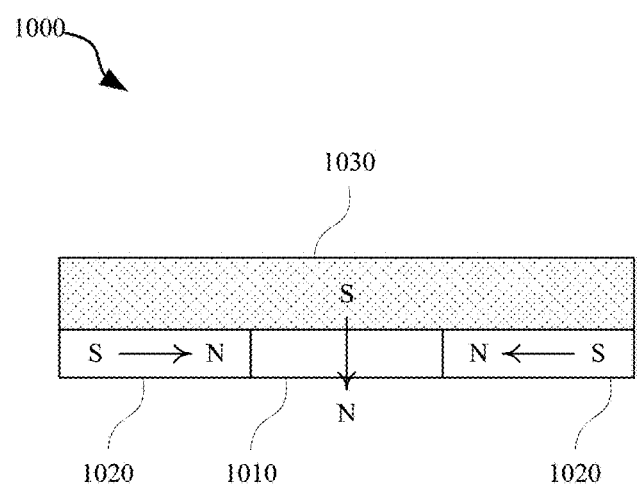
FIG. 10 illustrates a magnetic boosting device, in accordance with some embodiments.

FIG. 10 illustrates a magnetic boosting device 1000, in accordance with some embodiments. As shown in FIG. 10, the magnetic boosting device 1000 includes a layer of magnetic elements including: a primary magnetic element 1010 and one or more secondary magnetic elements 1020, similar to magnetic boosting devices 600 & 800. However, in addition to the layer of magnetic elements, the magnetic boosting device 1000 also includes a second layer that includes a magnetic shunt 1030. The magnetic shunt 1030 provides additional suppression of the resultant magnetic field on one side of the primary magnetic element 1010.

In some embodiments, the magnetic shunt 1030 includes a ferrous material (e.g., iron or iron alloy such as Alnico or NeFeB) that helps re-direct the resultant magnetic field on one side of the magnetic boosting device 1000. The magnetic shunt 1030 spans both the primary magnetic element 1010 and secondary magnetic element(s) 1020 such that the resultant magnetic field on the other side of the magnetic shunt 1030 from the primary magnetic element 1010 and secondary magnetic element(s) 1020 is further suppressed. In some embodiments, the magnetic shunt 1030 is a uniform ferrous metal or metal alloy. In other embodiments, the magnetic shunt 1030 is a matrix of particles of ferrous metal suspended uniformly in a non-ferrous material, such as a powder of ferrous metal or metal alloy mixed with a resin and cast in the shape of the magnetic shunt 1030.

In some embodiments, the magnetic shunt 1030 includes a non-ferrous material (e.g., aluminum). In some embodiments, the magnetic shunt 1030 is a uniform non-ferrous metal or metal alloy. In other embodiments, the magnetic shunt 1030 is a matrix of particles of non-ferrous metal suspended uniformly in a non-ferrous polymer, such as an aluminum powder mixed with a resin and cast in the shape of the magnetic shunt 1030. It will be appreciated that using a non-ferrous metal or metal alloy in the magnetic shunt 1030 can be less effective at suppressing the magnetic field on the other side of the magnetic shunt 1030 than using a ferrous metal or metal alloy in the magnetic shunt 1030.

Figure 11:
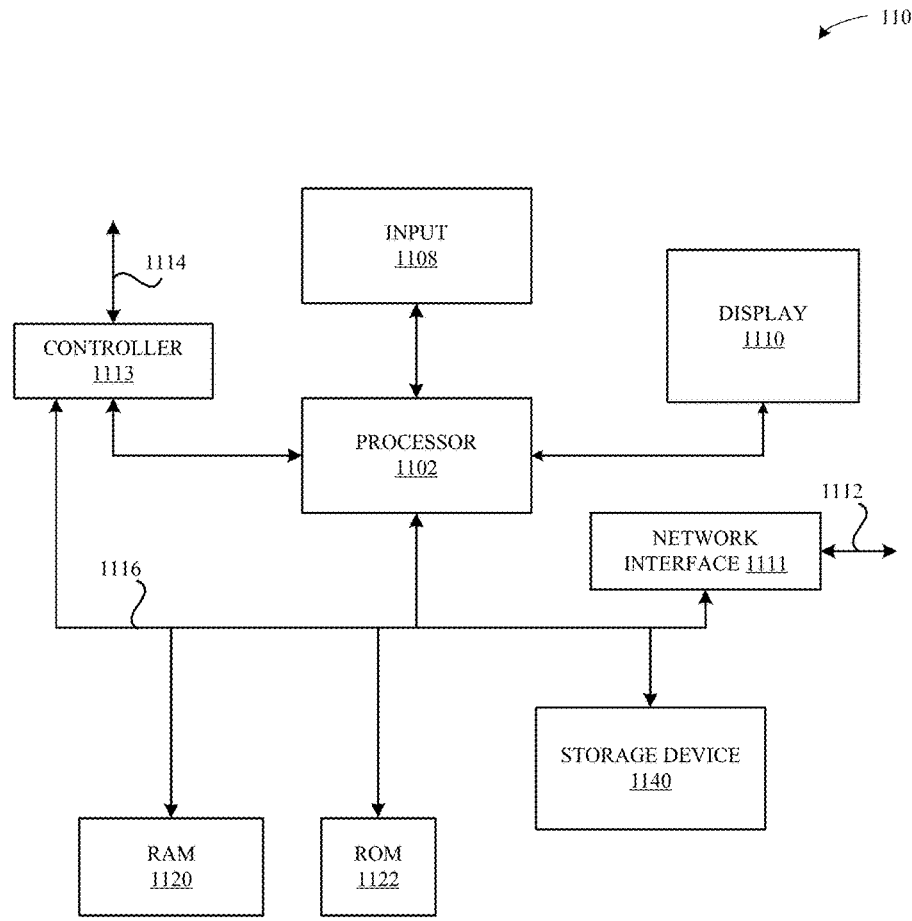
FIG. 11 illustrates a detailed view of a computing device that can be used to implement the various components described herein, according to some embodiments.

FIG. 11 illustrates a detailed view of a computing device 1100 that can be used to implement the various components described herein, according to some embodiments. In particular, the detailed view illustrates various components that can be included in the portable electronic device 100 illustrated in FIGS. 1-3, portable electronic device 400 illustrated in FIGS. 4A-4B, portable electronic device 500 illustrated in FIGS. 5A-5B, and/or various other portable or non-portable electronic devices described herein.

As shown in FIG. 11, the computing device 1100 can include a processor 1102 that represents a microprocessor or controller for controlling the overall operation of computing device 1100. The computing device 1100 can also include a user input device 1108 that allows a user of the computing device 1100 to interact with the computing device 1100. For example, the user input device 1108 can take a variety of forms, such as a button, keypad, dial, touch screen, audio input interface, visual/image capture input interface, input in the form of sensor data, etc. Still further, the computing device 1100 can include a display 1110 (screen display) that can be controlled by the processor 1102 to present visual information to the user. A data bus 1116 can facilitate data transfer between at least a storage device 1140, the processor 1102, and a controller 1113. The controller 1113 can be used to interface with and control different equipment through an equipment control bus 1114. For example, the controller 1113 can be used to interface with a sensor to detect a magnetic field proximate a portable electronic device and control the operation of the portable electronic device based on the magnitude of the magnetic field. For example, the controller 1113 can be in communication with the sensor 140 and configured to place the portable electronic device 100 into a power saving mode when the magnitude of the magnetic field measured by the sensor 140 exceeds a threshold value. The computing device 1100 can also include a network/bus interface 1111 that couples to a data link 1112. In the case of a wireless connection, the network/bus interface 1111 can include a wireless transceiver.

The computing device 1100 also include a storage device 1140, which can comprise a single disk or a plurality of disks (e.g., hard drives), and includes a storage management module that manages one or more partitions within the storage device 1140. In some embodiments, storage device 1140 can include flash memory, semiconductor (solid state) memory or the like. The computing device 1100 can also include a Random Access Memory (RAM) 1120 and a Read-Only Memory (ROM) 1122. The ROM 1122 can store programs, utilities or processes to be executed in a non-volatile manner. The RAM 1120 can provide volatile data storage, and stores instructions related to the operation of the computing device 1100.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The non-transitory computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A case for use with a portable electronic device, the case comprising:
   a cover coupled to the portable electronic device; and
   a magnetic boosting device carried within the cover and comprising:
   a layer of magnetic elements that extend within a plane defined by the cover, the layer of magnetic elements including:
   (i) a primary magnetic element that provides a first magnetic field, the primary magnetic element characterized by having magnetic poles that are aligned perpendicular to the plane of the cover, and
   (ii) a secondary magnetic element that provides a second magnetic field, the secondary magnetic element characterized by having magnetic poles that are aligned parallel to the plane of the cover,
   wherein the first magnetic field and the second magnetic field contribute to a resultant magnetic field that is asymmetrically disposed about the plane of the cover and wherein the resultant magnetic field is detectable by a sensor included in the portable electronic device such that a detected magnitude of the resultant magnetic field is (i) at or above a threshold value when the cover is in a closed position and (ii) below the threshold value when the cover is in an open position.

2. The case of claim 1, wherein the layer of magnetic elements further includes:
   one or more additional secondary magnetic elements, each additional secondary magnetic element providing a corresponding magnetic field and characterized as having magnetic poles that are aligned parallel to the plane of the cover.

3. The case of claim 1, wherein:
   a magnitude of the resultant magnetic field at a first point located on a first side of the plane of the cover is larger than a corresponding magnitude of the first magnetic field at the first point,
   a magnitude of the resultant magnetic field at a second point located on a second side of the plane of the cover is smaller than a corresponding magnitude of the first magnetic field at the second point, and
   the first point and the second point are symmetric with respect to the plane of the cover.

4. The case of claim 3, wherein at least one characteristic of the secondary magnetic element is tuned such that the magnitude of the resultant magnetic field at the second point is reduced below the threshold value.

5. The case of claim 4, wherein the magnitude of the resultant magnetic field measured at the second point is zero.

6. The case of claim 1, wherein at least one of the primary magnetic element or the secondary magnetic element are formed by:
   mixing a powder of ferrous metal or ferrous metal alloy with a resin to form a magnet blank; and
   applying an external magnetic field to the magnet blank to magnetize the magnet blank.

7. The case of claim 1, wherein at least one of the primary magnetic element or the secondary magnetic element are formed by:
   machining or otherwise forming a magnet blank from a billet of ferrous metal or ferrous metal alloy; and
   applying an external magnetic field to the magnet blank to magnetize the magnet blank.

8. The case of claim 1, wherein the portable electronic device includes
   a controller in communication with the sensor and configured to cause the portable electronic device to enter a power saving mode when the detected magnitude of the resultant magnetic field is at or above the threshold value.

9. The case of claim 1, wherein the magnetic boosting device is laminated between two layers of a flexible material to form the cover.

10. The case of claim 1, wherein the portable electronic device is one of a mobile phone or a tablet computer.

11. The case of claim 1, wherein the primary magnetic element is cylindrical and the secondary magnetic element is a ring magnet.

12. A portable electronic device that includes a protective cover, comprising:
- a magnetic boosting device carried within the protective cover and comprising:
  - a layer of magnetic elements that extend within a plane defined by the protective cover, the layer of magnetic elements including:
    - (i) a primary magnetic element that provides a first magnetic field, the primary magnetic element characterized by having magnetic poles that are aligned perpendicular to the plane of the protective cover, and
    - (ii) a secondary magnetic element that provides a second magnetic field, the secondary magnetic element characterized by having magnetic poles that are aligned parallel to the plane of the protective cover,
  - wherein the first magnetic field and the second magnetic field contribute to a resultant magnetic field that is asymmetrically disposed about the plane of the protective cover;
- a sensor located within a housing of the electronic device proximate the magnetic boosting device when the protective cover is in a closed position; and
- a controller in communication with the sensor and configured to place the electronic device into a power saving mode in response to detecting the protective cover in the closed position.

13. The portable electronic device of claim 12, wherein:
- a magnitude of the resultant magnetic field at a first point located on a first side of the plane of the protective cover is larger than a corresponding magnitude of the first magnetic field at the first point,
- a magnitude of the resultant magnetic field at a second point located on a second side of the plane of the protective cover is smaller than a corresponding magnitude of the first magnetic field at the second point, and
- the first point and the second point are symmetric with respect to the plane of the protective cover.

14. The portable electronic device of claim 13, wherein at least one characteristic of the secondary magnetic element is tuned such that the magnitude of the resultant magnetic field at the second point is reduced below a threshold value.

15. The portable electronic device of claim 14, wherein the magnitude of the resultant magnetic field measured at the second point is zero.

16. The portable electronic device of claim 12, wherein the portable electronic device further comprises a processor and a display, and wherein the protective cover is configured to overlap extents of the display when the protective cover is in the closed position.

17. A device for boosting a magnetic field associated with a case for a portable electronic device, the device carried within a cover of the case and comprising:
- a layer of magnetic elements that extend within a plane defined by the cover, the layer of magnetic elements including:
  - (i) a primary magnetic element that provides a first magnetic field, the primary magnetic element characterized by having magnetic poles that are aligned perpendicular to the plane of the cover, and
  - (ii) a secondary magnetic element that provides a second magnetic field, the secondary magnetic element characterized by having magnetic poles that are aligned parallel to the plane of the cover,
- wherein the first magnetic field and the second magnetic field contribute to a resultant magnetic field that is asymmetrically disposed about the plane of the cover and wherein the resultant magnetic field is detectable by a sensor included in the portable electronic device such that a detected magnitude of the resultant magnetic field is (i) at or above a threshold value when the cover is in a closed position and (ii) below the threshold value when the cover is in an open position.

18. The device of claim 17, wherein at least one characteristic of the secondary magnetic element is tuned such that the detected magnitude of the resultant magnetic field at a particular point is reduced below a threshold value.

19. The device of claim 17, wherein:
- the layer of magnetic elements further including one or more additional secondary magnetic elements,
- a cross-sectional shape of the primary magnetic element is polygonal, and
- a number of secondary magnetic elements in the layer of magnetic elements, which includes the secondary magnetic element and the one or more additional secondary magnetic elements, is equal to a number of sides of the cross-sectional shape of the primary magnetic element.

20. The device of claim 17, wherein:
- a cross-sectional shape of the primary magnetic element is circular, and
- the secondary magnetic element is a ring magnet that surrounds the primary magnetic element.

* * * * *